(12) United States Patent
Akiyama

(10) Patent No.: US 8,755,599 B2
(45) Date of Patent: Jun. 17, 2014

(54) REVIEW APPARATUS AND INSPECTION SYSTEM

(75) Inventor: Hiroteru Akiyama, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 420 days.

(21) Appl. No.: 12/902,622

(22) Filed: Oct. 12, 2010

(65) Prior Publication Data

US 2011/0091099 A1   Apr. 21, 2011

(30) Foreign Application Priority Data

Oct. 16, 2009   (JP) .................... 2009-239847

(51) Int. Cl.
  *G06K 9/62*   (2006.01)
  *G06K 9/00*   (2006.01)
(52) U.S. Cl.
  USPC ........... 382/167; 382/141; 382/145; 382/149; 382/154
(58) Field of Classification Search
  USPC .................. 382/167, 141, 145, 149
  See application file for complete search history.

(56) References Cited

U.S. PATENT DOCUMENTS

| 5,459,589 A * | 10/1995 | Ohnishi et al. ................. 358/518 |
| 2004/0184652 A1* | 9/2004 | Tsuchiya et al. .............. 382/144 |
| 2005/0172255 A1* | 8/2005 | Tsuchiya et al. ................. 716/19 |

FOREIGN PATENT DOCUMENTS

JP   2008-112178 A   5/2008

OTHER PUBLICATIONS

U.S. Appl. No. 13/440,080, filed Apr. 5, 2012, Akiyama, et al.

* cited by examiner

*Primary Examiner* — Matthew Bella
*Assistant Examiner* — Weiwen Yang
(74) *Attorney, Agent, or Firm* — Oblon, Spivak, McClelland, Maier & Neustadt, L.L.P.

(57) ABSTRACT

A review apparatus comprises: means for acquiring a reference image and an optical image by associating the data of the reference image and the data of the optical image with the gradation values defined by a color palette selected from among a plurality of first color palettes; and means for acquiring a comparison image by associating comparison image data that can be acquired from the reference image data and the optical image data with the gradation values defined by a color palette selected from among a plurality of second color palettes. Gradation values for the comparison image data are represented by gradation values for the reference image data and gradation values for the optical image data.

10 Claims, 6 Drawing Sheets

Gradation values of reference image

REVIEW APPARATUS AND INSPECTION SYSTEM

BACKGROUND OF THE INVENTION

1. Field of the Invention

The present invention relates to a Review Apparatus and to an Inspection System for receiving information on defect locations.

2. Background Art

The recent larger-scale integration and capacity increases of LSI circuits have further reduced the circuit line widths needed for semiconductor devices. Fabrication of semiconductor devices involves the use of photomasks or reticles (hereinafter referred to collectively as masks) on which circuit patterns are formed. The circuit patterns on a mask are photolithographically transferred onto a wafer with the use of a reduced-projection exposure system, often called a stepper, whereby the circuit patterns are formed on the wafer. Masks are manufactured using an electron-beam writing apparatus which is capable of writing fine patterns with an electron beam. Attempts have also been made to develop laser-beam writing apparatuses which use a laser beam for pattern writing. The electron-beam writing apparatus is also used for writing circuit patterns directly onto a wafer.

Yield increase is an important aspect of LSI circuit manufacturing which is considerably costly. However, it will be more difficult to achieve because the sizes of LSI circuit patterns are now on the verge of shifting from submicron to nanometer dimensions, as epitomized by DRAMs (Dynamic Random Access Memory) with a capacity of more than 1 gigabit. One of the major factors leading to yield decrease is defective patterns on masks, but much smaller defective patterns will need to be detected, as necessitated by the size decrease of LSI circuit patterns to be formed on semiconductor wafers. Accordingly, inspection systems for detecting defects on masks need to have a high level of detection accuracy.

One method for defect detection is the die-to-database inspection. Under this method, write data (design pattern data) is input to the inspection system so that the system can create design image data (reference image) from the write data. The write data is often created by converting CAD data into a format a pattern writing apparatus can receive. The system then acquires sensor data (optical image) by imaging patterns, thereby comparing the optical image against the reference image.

In the die-to-database inspection, the light emitted from a light source is directed to a mask via an optical system for inspection of the mask. The mask is placed on a table, and moving the table allows the light to scan across the mask. The light rays that have passed through or been reflected by the mask are focused on an image sensor by a lens, and an optical image acquired by the image sensor is transmitted as sensor data to a comparator. Based on algorithms, the comparator compares the sensor data against its associated design image data. Any discrepancies between the two data sets suggest the presence of defective patterns (see Japanese Patent Laid-Open No. 2008-112178).

A defect inspection system often uses multiple algorithms, depending on defect types. Each of the algorithms has a threshold value, and defects are detected when response values exceed the threshold values. To determine a threshold value, a tentative threshold value is first set for an algorithm, and the defect inspection result obtained with the tentative threshold value is then reviewed. These steps are repeated (i.e., another tentative value is set for the algorithm, followed by a review of the result) until sufficient detection sensitivity is obtained. Then, the tentative threshold value that produced the sufficient sensitivity is set as the threshold value of that algorithm.

In defect inspection, possible defects are displayed on a monitor based on the data created from an inspection result, and the operator is supposed to judge whether or not they are real or problematic defects and classify them. Specifically, a comparison image is created from an optical image (sensor data) and a reference image, and the operator reviews possible defects on the comparison image. Each pixel of those images is represented by a gradation value. Specifically, a color palette with 256 gradation values is used to assign to each pixel one value selected from among 0 to 255, whereby write patterns and defects can be displayed.

The optical image is obtained by imaging actually written patterns; thus, the pattern edges (i.e., pattern boundaries) on the optical image often do not look ideal as defined by its associated write data. For instance, even when the write data defines the boundary of a pattern as a rectangle, the optical image often displays it as a gentle taper instead of the rectangle. For this reason, gradation values are often subject to gradual changes around pattern edges. Therefore, upon defect judgment, it is necessary to precisely define the locations of pattern edges.

Conventionally, a comparison image is created by calculating the differences in gradation value between a reference image and an optical image. Because any differences between the reference image and optical image are displayed on the comparison image, a careful look at the comparison image allows identification of where defects are located. As stated above, however, much smaller defective patterns will need to be detected, as necessitated by the size decrease of LSI circuit patterns to be formed on semiconductor wafers. Thus, tiny defects on a comparison image will be more difficult to visually identify if the conventional method is used.

Further, although the widths of pattern edges displayed on a reference image and an optical image are defined by a particular value, defects may be hidden by the pattern edges when narrower than the pattern edges. Conventionally, such pattern edges are displayed in black; in such a case, it is extremely difficult to visually identify tiny defects when they are located within the pattern edges. Another problem is that it is more difficult to distinguish between write patterns and pattern edges when the write patterns are extremely small. In that case, tiny defects can be identified more easily by enlarging the gradation value differences between where patterns exist and where they do not, but this also makes large defects less visible.

The present invention has been contrived to address the above problems. That is, one object of the invention is to provide a review apparatus and an inspection system that allow the operator to visually identify defects with ease, irrespective of defect types and sizes.

Other challenges and advantages of the present invention are apparent from the following description.

SUMMARY OF THE INVENTION

According to one aspect of the present invention, a review apparatus comprises; means for acquiring a first image and a second image by associating data of the first image and data of the second image with gradation values defined by a color palette selected from among a plurality of color palettes, and a means for acquiring a comparison image by associating comparison image data that can be acquired from the first image data and the second image data with gradation values defined by a different color palette selected from among the plurality of color palettes.

According to another aspect of the present invention, a review apparatus comprises; means for acquiring a first image and a second image by associating data of the first image and data of the second image with gradation values defined by a color palette selected from among a plurality of first color palettes, and means for acquiring a comparison image by associating comparison image data that can be acquired from the first image data and the second image data with gradation values defined by a color palette selected from among a plurality of second color palettes. In the plurality of second color palettes each have gradation values for the first image data and gradation values for the second image data. Gradation values for the comparison image data are represented by the gradation values for the first image data and the gradation values for the second image data.

According to other aspect of the present invention, an inspection system comprises; means for acquiring a first optical image of an inspection object by irradiating the object with light, means for creating a first reference image against which to compare the first optical image, an inspection apparatus having means for comparing the first optical image against the first reference image, and a review apparatus for receiving information on defect locations obtained by the comparing means and also receiving the first optical image and the first reference image. The review apparatus comprises; means for acquiring a second optical image and a second reference image by associating data of the first optical image and data of the first reference image with gradation values defined by a color palette selected from among a plurality of first color palettes, and means for acquiring a second comparison image by associating data of a first comparison image that can be acquired from the first optical image data and the first reference image data with gradation values defined by a color palette selected from among a plurality of second color palettes.

DETAILED DESCRIPTION OF THE EMBODIMENTS

Figure 1:
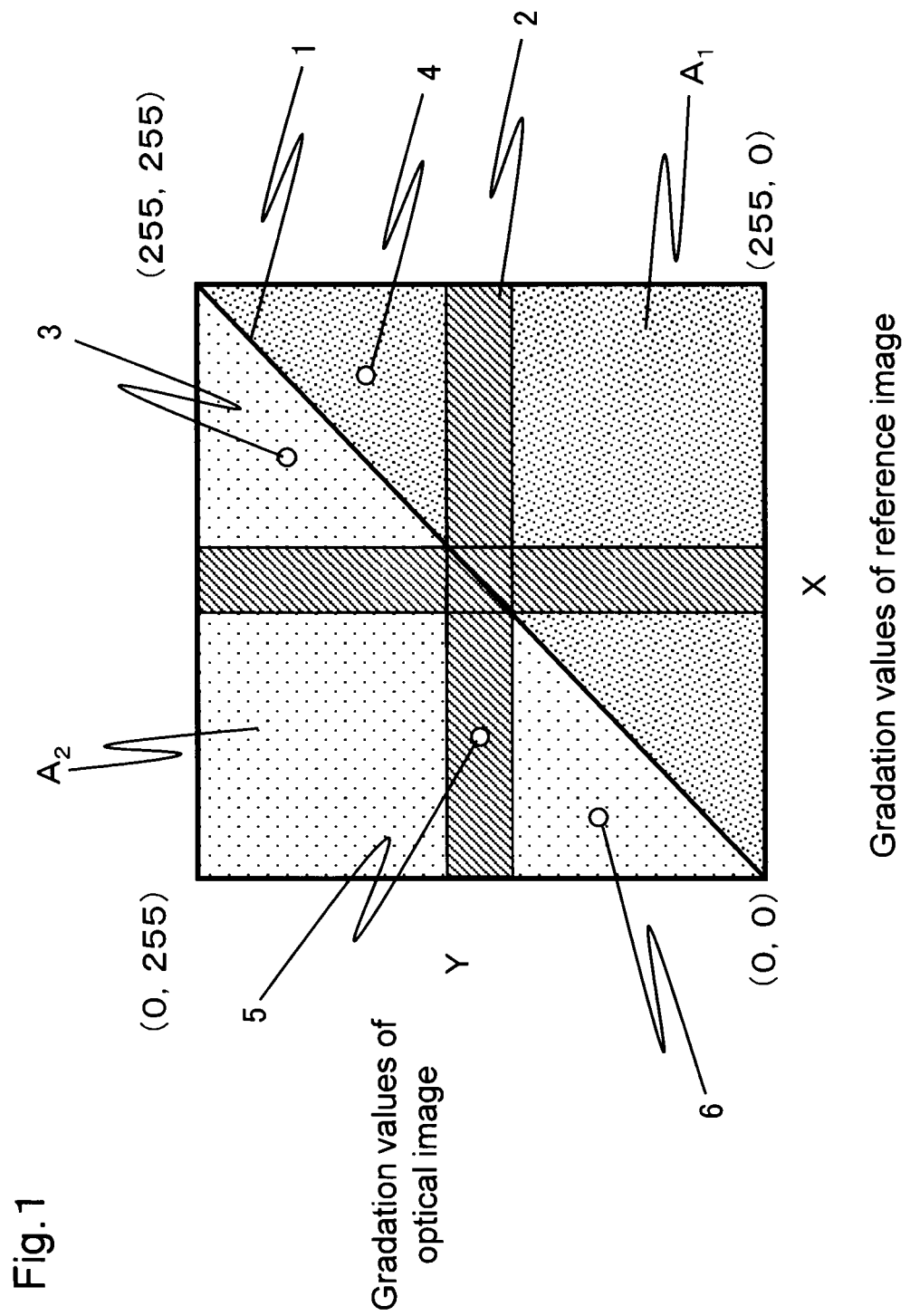
FIG. 1 shows the representation of a comparison image by two-dimensional gradation values.

As stated above, by reviewing possible defects displayed on a comparison image, the operator judges whether or not they are real or problematic defects and classify them. The comparison image is created from a reference image and an optical image, and each pixel of those images is represented by a gradation value. A conventional method for displaying those images is to use a single color palette with 256 gradation values and assign to each pixel of those images one value selected from among 0 to 255. In other words, the same color palette has been used for all those images, irrespective of defect types and sizes. For this reason, considerable difficulties have been involved when the operator visually identifies some defects during defect review. In some cases, two different color palettes are used, one for reference images and optical images and the other for comparison images, but the result is the same in terms of whether the operator is able to visually identify defects. This is because gradation values are assigned always from the same color palettes, irrespective of defect types and sizes.

Thus, in one aspect of the invention, multiple color palettes are provided, and suitable ones are selected from among them based on the types of images (i.e., reference images, optical images, or comparison images) and the types, sizes, and locations of defects. In this case, a comparison image is created by calculating the differences in gradation value between a reference image and an optical image. Because any differences between the reference image and optical image are displayed on the comparison image, a simple look at the comparison image allows identification of where defects are located. Since this aspect of the invention allows selection of color palettes based on images and defects, circuit patterns and defects can be visually identified with ease. Preferably, those color palettes are gamma-corrected by applying different correction coefficients to the colors with the same gradation value. This further increases the visibility of defects because the operator can select a color that makes defects more visible from among the colors with the same gradation value.

In another aspect of the invention, multiple color palettes (first color palettes) are provided for reference images and optical images. In addition, multiple color palettes (second color palettes) are provided for comparison images. Preferably, both the number of the first color palettes and the number of the second color palettes are about three or four. Each of the second color palettes has gradation values for reference image data and gradation values for optical image data. Gradation values for comparison image data are therefore represented by the gradation values for the reference image data and the gradation values for the optical image data. In other words, according to this aspect of the invention, a comparison image is represented by two-dimensional gradation values while a reference image and an optical image are each represented by one-dimensional gradation values.

When creating a comparison image from a reference image and an optical image, applying the gradation value differences between the mutually corresponding pixels of the reference image and optical image to the corresponding pixels of the comparison image allows the comparison image to display the differences (i.e., defect locations). In this case, since the reference image and optical image are each represented by one-dimensional gradation values, the comparison image is also represented by one-dimensional gradation values (i.e., the differences in gradation value between the reference image and optical image). Assume, for example, that the gradation value of Pixel A of the reference image is 100 and the gradation value of Pixel A of the optical image is 90. In that case, Pixel A of the comparison image has a gradation value of 10. Likewise, if Pixel B of the reference image and Pixel B of the optical image have gradation values of 200 and 190, respectively, then, Pixel B of the comparison image has a gradation value of 10.

When the pixels of the comparison image in the above example are instead represented two-dimensionally, Pixel A of the comparison image has gradation values (100, 90), and Pixel B of the comparison image has gradation values (200, 190). While the one-dimensional representation in the above example results in Pixels A and B of the comparison image having the same gradation value (i.e., 10), the two-dimensional representation results in those same pixels having different values. That is, the two-dimensional representation allows different values to be used for the representation of pixels which can conventionally be represented only by identical values. This means that the two-dimensional representation provides much more information than the one-dimensional representation.

With reference now to FIG. 1, the representation of a comparison image by two-dimensional gradation values is further discussed.

In FIG. 1, the x-axis represents the gradation values of a reference image while the y-axis represents the gradation values of an optical image. When the gradation value of a pixel of the reference image or the optical image is 0, it means that no pattern is present at the location corresponding to that pixel. Conversely, when the gradation value of a pixel of the reference image or the optical image approaches 255, it means that a pattern is present at the location corresponding to that pixel. When no defective pattern is present, the gradation values of the reference image and the gradation values of the optical image are all equal. That is, all the pixels of the comparison image, which are represented by the gradation values of the reference image and optical image, are on Line 1 that connects the point (0, 0) and the point (255, 255). If, on the other hand, a pixel of the comparison image is away from Line 1, it means a defect is present at the location corresponding to that pixel.

The boundaries between areas with patterns and areas without patterns are represented by pattern edges. In the case of FIG. 1, pattern edges 2 are present in such a way as to divide the whole area of FIG. 1 into four. The pattern edges 2 are defined to have a certain range of gradation values. It is to be noted that the pattern edges 2 are defined by the foregoing first color palettes applied to reference images and optical images and that the foregoing second color palettes applied to comparison images do not have such pattern edge information.

Now assume that a pixel of the comparison image has the gradation values denoted by reference numeral 3 in FIG. 1. The pixel lies within one of the four pattern formation areas and away from Line 1; thus, a defect is likely to exist at the location corresponding to that pixel. According to this two-dimensional representation of gradation, it is likely that a pattern has been formed where it should not be. Therefore, the defect is likely to be a convex defect.

As another example, assume that a pixel of the comparison image has the gradation values denoted by reference numeral 4 in FIG. 1. The pixel also lies within one of the four pattern formation areas and away from Line 1; thus, a defect is likely to exist at the location corresponding to that pixel. According to this two-dimensional representation of gradation, it is likely that a pattern has not been formed where it should be. Therefore, the defect is likely to be a concave defect.

In another example, assume that a pixel of the comparison image has the gradation values denoted by reference numeral 5 in FIG. 1. The pixel lies within the pattern edges 2 and away from Line 1; thus, a defect is likely to exist at the location corresponding to that pixel.

As a further example, assume that a pixel of the comparison image has the gradation values denoted by reference numeral 6 in FIG. 1. The pixel lies within one of the four pattern formation areas and away from Line 1; thus, a defect is likely to exist at the location corresponding to that pixel. According to this two-dimensional representation of gradation, it is likely that a pattern has been formed where it should not be. Therefore, the defect is likely to be a convex defect.

As stated above, defect types can be predicted by creating a comparison image using a color palette with two-dimensional gradation values. When, on the other hand, a comparison image is created by calculating the differences in gradation value between a reference image and an optical image, the prediction of defect types is not feasible although the presence or absence of defects can be known. When a comparison image is represented by two-dimensional gradation values, however, it is possible not only to know the presence or absence of defects but also to predict defect types. As the above examples of FIG. 1 suggest, when a pixel of a comparison image is located in the lower right area $A_1$ of FIG. 1, which is on the side of the point (255, 0) with respect to Line 1, this suggests that a concave defect is present at the location corresponding to that pixel. When, on the other hand, a pixel of the comparison image is located in the upper left area $A_2$ of FIG. 1, which is on the side of the point (0, 255) with respect to Line 1, this suggests that a convex defect is present at the location corresponding to that pixel. Note however that these rules apply to the die-to-database inspection. In the case of the die-to-die inspection in which two optical images are compared, which optical image has a defect determines the relationship between the areas $A_1$ and $A_2$ or between concave and convex defects.

Figure 2:
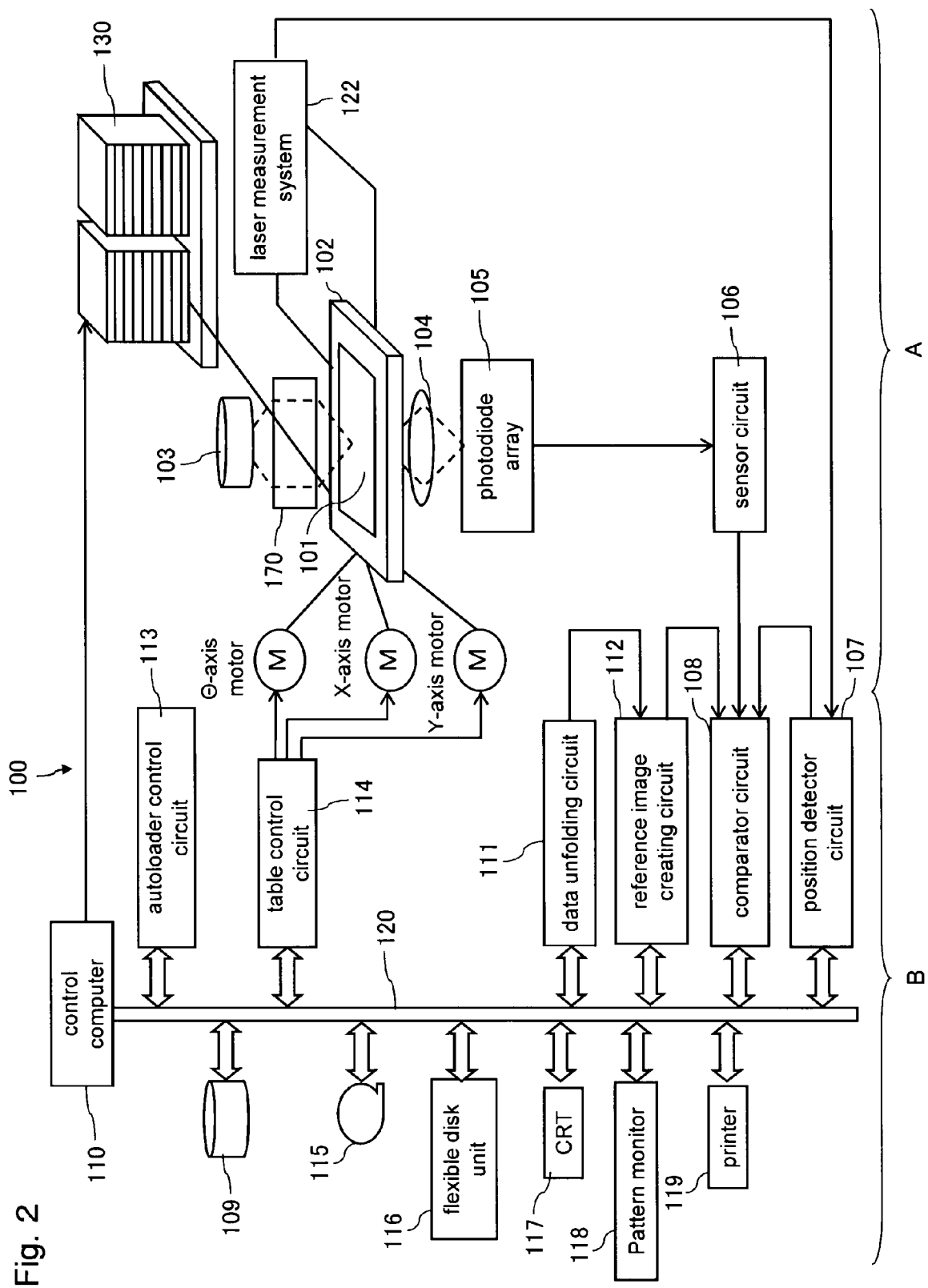
FIG. 2 illustrates the configuration of an inspection apparatus according to an embodiment of the invention.

FIG. 2 illustrates the configuration of an inspection apparatus according to an embodiment of the invention. This embodiment is intended for inspection of photolithography masks, but can also be used for wafer inspection As illustrated in FIG. 2, an inspection apparatus 100 includes an optical image acquisition unit A and a control unit B.

The optical image acquisition unit A comprises the following components: a light source 103; a table 102 movable in horizontal directions (X directions and Y directions) and in rotational directions (θ directions); a transmissive illumination system 170; an optical magnifier system 104; a photodiode array 105; a sensor circuit 106; a laser measurement system 122; and an autoloader 130.

The control unit B includes a control computer 110 that controls the entire operation of the inspection apparatus 100. The control computer 110 is connected via a data transfer bus 120 to the following components: a position detector circuit 107; a comparator circuit 108; a reference-image creating circuit 112; a data unfolding circuit 111; an autoloader control circuit 113; a table control circuit 114; a magnetic disk unit 109; a magnetic tape unit 115; a flexible disk unit 116; a CRT 117; a pattern monitor 118; and a printer 119. The table 102 is actuated by the table control circuit 114 operating an X-axis motor, Y-axis motor, and θ-axis motor. These motors can be, for example, stepper motors.

The magnetic disk unit 109 stores design pattern data, that is, the reference data for the die-to-database inspection. The design pattern data is readout to the data unfolding circuit 111 when necessary during inspection. The data unfolding circuit 111 converts the design pattern data into design image data (pixel data). The design image data is then transmitted to the reference-image creating circuit 112, where a reference image is created.

While FIG. 2 illustrates only the essential components needed for the present embodiment, other known components can also be included for mask inspection.

Figure 3:
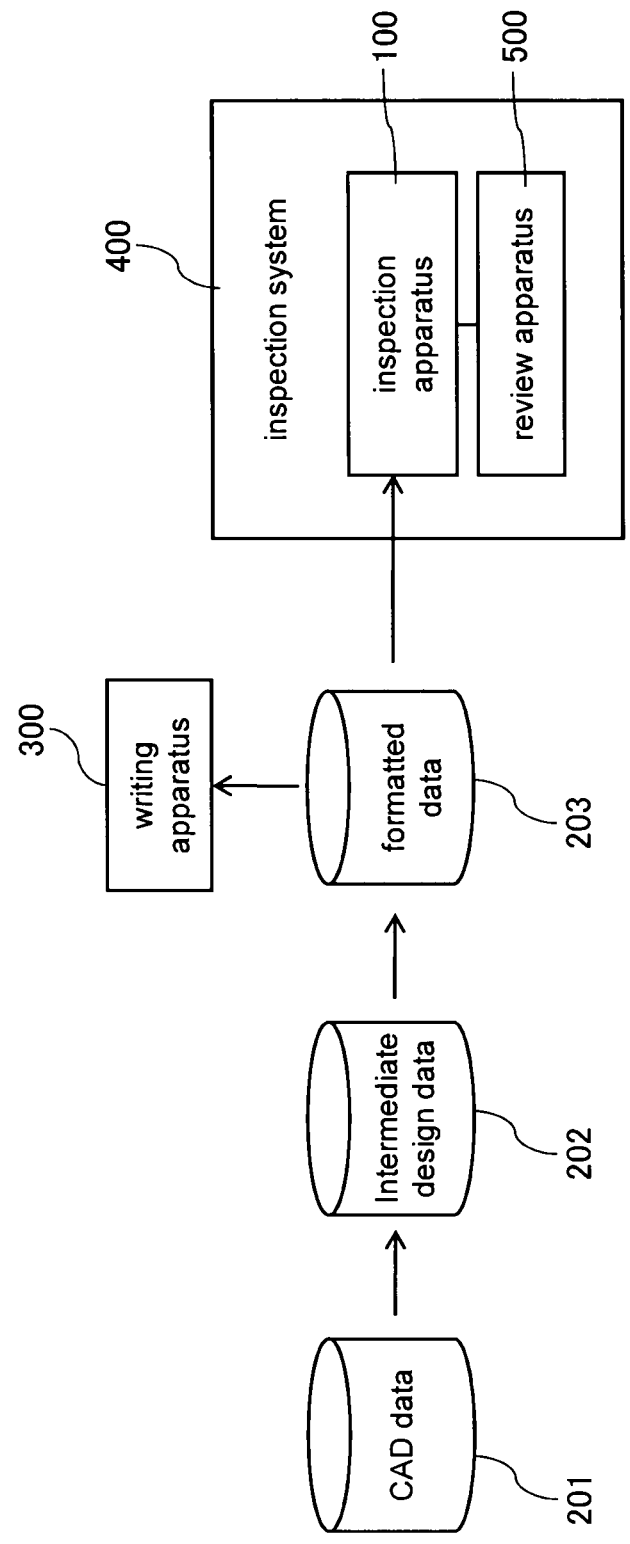
FIG. 3 conceptually illustrates the data flow according to the present embodiment.

FIG. 3 conceptually illustrates the data flow according to the present embodiment.

As illustrated, CAD data 201 created by the operator or a designer is converted into intermediate design data 202 of a layered format such as OASIS or the like. The intermediate design data 202 is the data of patterns to be written on masks and created on a layer-by-layer basis. Note here that as with typical pattern writing apparatuses, a writing apparatus 300 is not configured to directly read in OASIS data because data formats used in writing apparatuses vary from manufacturer to manufacturer. For this reason, the intermediate design data 202 (OASIS data) is converted on a layer-by-layer basis into formatted data 203 specific to the wiring apparatus 300, and the formatted data 203 is thereafter input to the writing apparatus 300. The inspection apparatus 100 is also not configured to directly read in OASIS data; thus, the intermediate design data 202 is converted into the formatted data 203 before being input to the inspection apparatus 100. Note that the formatted data 203 can instead be converted into a data format specific to the inspection apparatus 100, not to the wiring apparatus 300, before being input to the inspection apparatus 100.

The formatted data 203 for pattern writing or defect inspection and the intermediate design data 202 include auxiliary pattern data to increase the resolution of patterns to be written on masks and also include complex plane figures with which to write complex patterns for the purpose of ensuring the accuracy of pattern line widths and spaces. Thus, the volumes of the formatted data 203 and of the intermediate design data 202 are considerably large. For this reason, the writing apparatus 300 and the inspection apparatus 100 are designed not to slow down pattern writing and defect inspection. Specifically, each of the wiring apparatus 300 and the inspection apparatus 100 has its data readout/unfolding unit connected to a parallel processor and to a high-read-speed hard disk unit.

Figure 4:
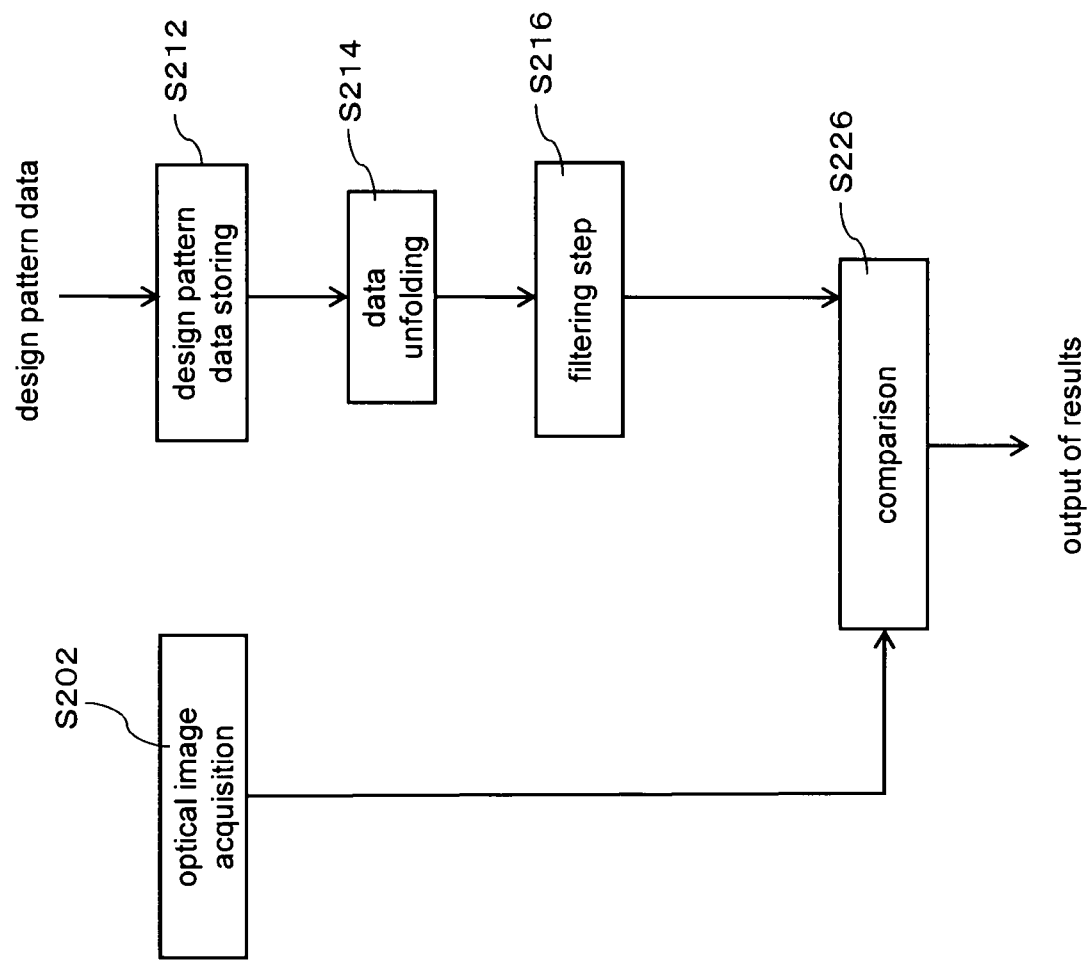
FIG. 4 is an inspection flowchart.

FIG. 4 is an inspection flowchart.

As illustrated in FIG. 4, the inspection process includes the following steps: optical image acquisition (S202); design pattern data storing (S212); data unfolding to create design image data (S214); filtering (S216); and comparison (S226).

In the optical image acquisition S202, the optical image acquisition unit A of FIG. 2 acquires an optical image (sensor data) of a mask 101. The optical image is an image of the mask 101 on which patterns have been formed based on design pattern data. The optical image acquisition S202 takes the following steps.

The mask 101 to be inspected is first placed on the table 102. A light beam is emitted from the light source 103 located above the table 102 and then directed through the transmissive illumination system 170 to the mask 101. Located below the mask 101 are the optical magnifier system 104, the photodiode array 105, and the sensor circuit 106. After passing through the mask 101 and the optical magnifier system 104, the light beam is captured by the photodiode array 105 as an optical image. The optical magnifier system 104 can be focus-controlled automatically by an autofocus mechanism not illustrated.

Figure 5:
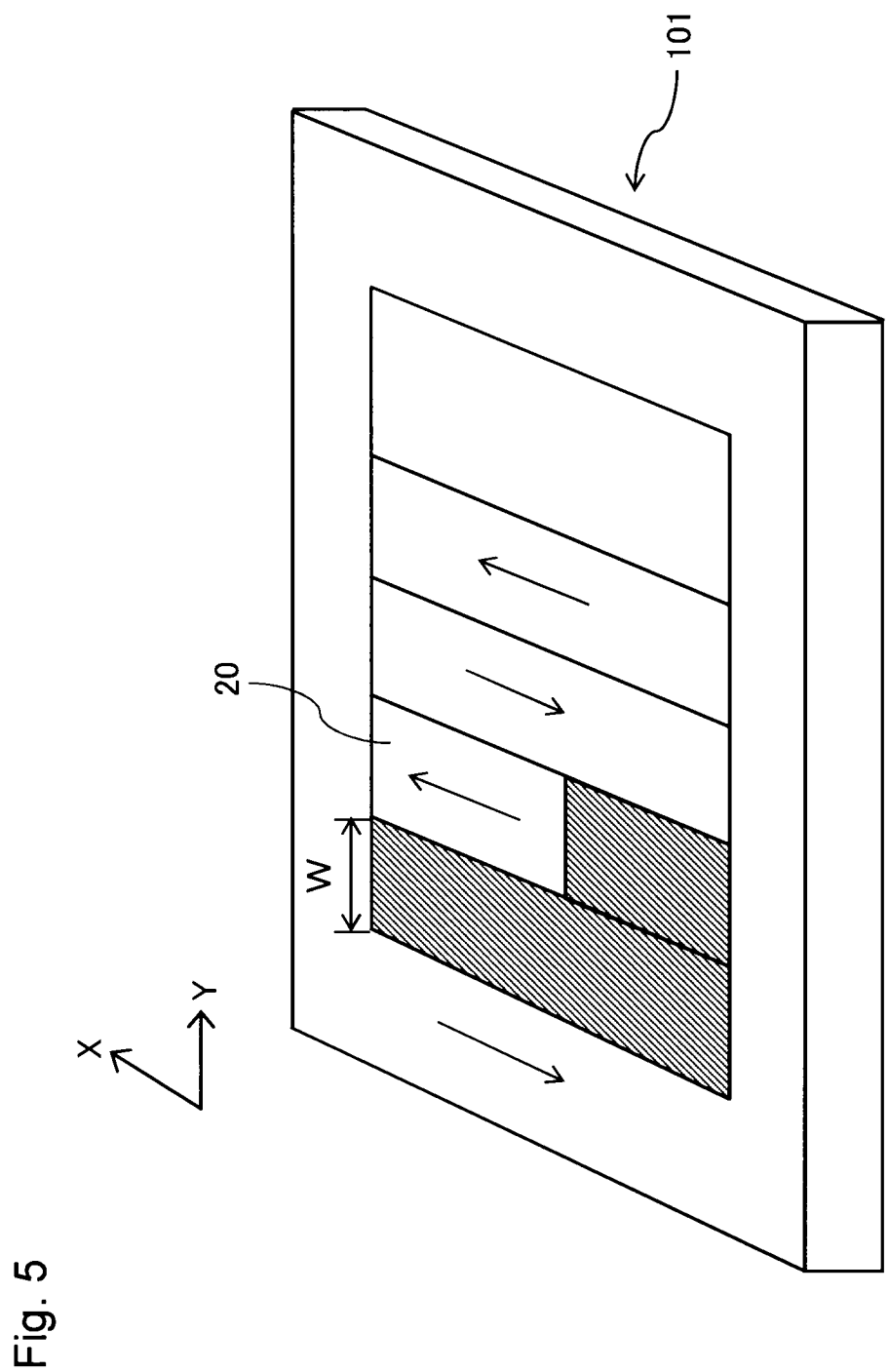
FIG. 5 the optical image acquisition is described in greater detail.

With reference now to FIG. 5, the optical image acquisition S202 is described in greater detail.

As illustrated in FIG. 5, the entire inspection area is sectioned in a Y direction into strip areas 20, each of a scan width W. An optical image is acquired by moving the table 102 along the strip areas 20 and by the photodiode array 105 consecutively acquiring strip-shaped images each of the scan width W. An image of a first strip area (the leftmost strip area of FIG. 5) is first acquired by moving the table 102 in the positive X direction. Next, an image of a second strip area (the strip area next to the first strip area) is acquired by moving the table 102 in the negative X direction. An image of a third strip area (the third strip area from the left) is then acquired by moving the table 102 in the positive X direction. Such consecutive image acquisition takes less processing time.

The photodiode array 105 consecutively acquires pattern images as above and then converts them from light to current or voltage. The sensor circuit 106 thereafter performs A/D conversion on the current or voltage. The photodiode array 105 is provided with a TDI (Time Delay Integration) sensor.

To be precise, the above optical image acquisition is performed by this TDI sensor while the table 102 is continuously moved in the positive and negative X directions. The light source 103, the optical magnifier system 104, the photodiode array 105, and the sensor circuit 106 constitute a high-magnification optical inspection system.

As stated above, the table control circuit 114 controls the movement of the table 102 as instructed by the control computer 110, and the table 102 is actuated by the X-axis motor, Y-axis motor, and θ-axis motor, which are for example, stepper motors. The position of the table 102 is detected by the laser measurement system 122, and its information is sent to the position detector circuit 107. The mask 101 placed on the table 102 is automatically loaded from the autoloader 130 when instructed by the autoloader control circuit 113. After the completion of defect inspection, the mask 101 is automatically unloaded from the table 102.

After performing the A/D conversion, the sensor circuit 106 transmits the digital output, which is equivalent to sensor data (i.e., an optical image), to the comparator circuit 108. At this time, the comparator circuit 108 also receives the data indicating the position of the mask 101 on the table 102 from the position detector circuit 107. The sensor data is, for example, unsigned 8-bit data and contains the brightness gradation level of each pixel.

During the design pattern data storing S212 of FIG. 4, the magnetic disk unit 109 (only meant to be an example of a data storage unit) stores the design pattern data which has been used for pattern writing on the mask 101.

The design pattern data includes various plane figures, primary examples of which are rectangles and triangles. The magnetic disk unit 109 stores figure data which defines the shapes, sizes, and positions of such figures. The figure data includes, for example, such information as the coordinates of a figure with respect to a reference position, side lengths, and figure codes with which to identify figure types.

A group of geometric plane figures that exist within an area of tens of micrometers is commonly termed a cluster or cell, and data layering is performed on a cluster-by-cluster basis. Alignment coordinates or repetitive descriptions are defined for the cluster so that a plane figure can be aligned independently or aligned repeatedly at particular intervals. The data of the cluster is assigned to a strip area (also called a frame) which is several hundreds of micrometers in width and approximately 100 mm in length (the length is equal to the X-directional or Y-directional length of a mask).

During the data unfolding S214 of FIG. 4, the data unfolding circuit 111 of FIG. 2 reads out the design pattern data from the magnetic disk unit 109 based on an instruction from the control computer 110 and then converts the design pattern data into binary or multi-valued image data (design image data). The design image data is thereafter transmitted to the reference-image creating circuit 112.

After receiving the design pattern data, the data unfolding circuit 111 unfolds it into figure data and interprets the figure codes, figure dimensions, and the like, specified by the figure data. The data unfolding circuit 111 then converts the design pattern data into the binary or multi-valued design image data as patterns to be aligned on the cells of a grid of given quantized dimensions. To create the design image data, calculations are performed to determine the occupancy rates at which the plane figures of the design patterns take up areas (cells) that each correspond to a sensor pixel. The figure occupancy rate within each pixel is set as a pixel value.

During the filtering S216 of FIG. 4, the reference-image creating circuit 112 performs filtering on the design image data it received from the data unfolding circuit 111.

Figure 6:
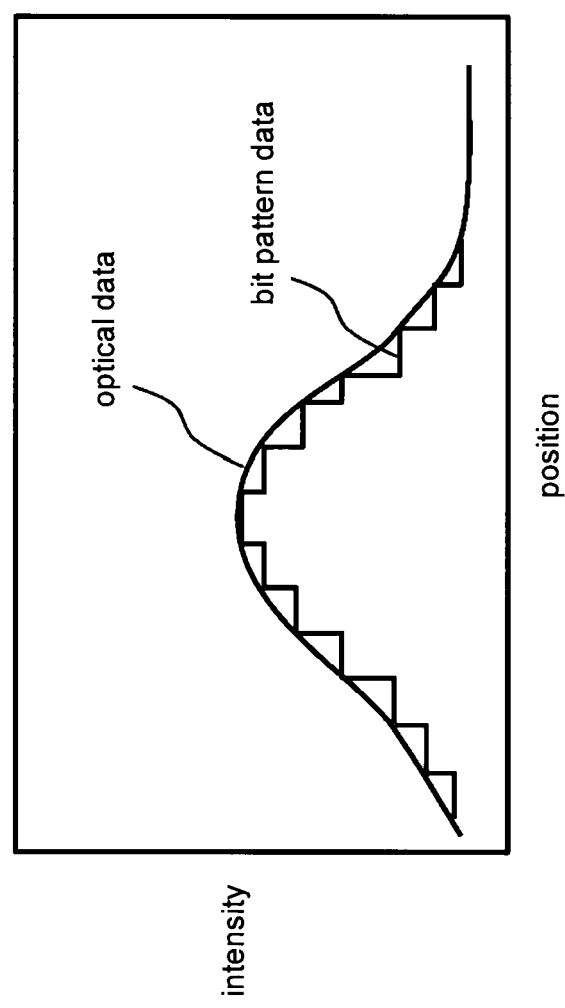
FIG. 6 is a graph to illustrate the filtering.

FIG. 6 is a graph to illustrate the filtering S216.

The sensor data (optical image) obtained by the sensor circuit 106 is in a filtered state due to the resolving characteristics of the optical magnifier system 104 and to the aperture effects of the photodiode array 105; in other words, the sensor data is in a continuously-changing analog state. Thus, the design image data, which has digital image intensity values (digital gradation values), needs to be filtered, so that both the design image data and the sensor data can be in a similar state. By thus filtering the design image data, a reference image against which to compare the optical image is created.

The sensor data (optical image) is transmitted from the sensor circuit 106 to the comparator circuit 108 as already stated. The design pattern data, on the other hand, is converted into the design image data (reference image) by the data unfolding circuit 111 and by the reference-image creating circuit 112, and the design image data is then transmitted to the comparator circuit 108.

During the comparison S226 of FIG. 4, the comparator circuit 108 uses an appropriate comparison algorithm to compare the optical image obtained from the sensor circuit 106 and the reference image created by the reference-image creating circuit 112. When there is any pixel at which the difference between the two exceeds a particular value, the comparator circuit 108 judges that pixel as having a defect. When there is a pixel judged as having a defect, its coordinates and the optical and reference images on which the judgment is based are stored as an inspection result.

As illustrated in FIG. 3, an inspection system 400 according to the invention comprises the inspection apparatus 100 and a review apparatus 500 with which the operator reviews inspection results. Review refers specifically to the operator's judgment on whether or not detected defects are real or problematic defects.

Next described is an inspection method using the review apparatus 500.

The review apparatus 500 includes multiple color palettes. The color palettes are created by color-palette creating means which is different from its counterpart for the inspection system 400. The color palettes can be created while the operator views an optical image, which represents an actual inspection result, to check the image visibility.

After the completion of an inspection by the inspection apparatus 100, its result is transmitted from the inspection apparatus 100 to the review apparatus 500. The result includes detected defect locations, reference images, and optical images. These reference and optical images transmitted from the inspection apparatus 100 are grayscale images; thus, the review apparatus 500 converts them into color images for the purpose of enhancing the image visibility. In the present embodiment, multiple color palettes are used for the grayscale-to-color conversion. The example that follows is based on the assumption that a color palette for reference images and optical images is selected from a group of color palettes and a color palette for comparison images is selected from another group of color palettes. Alternatively, however, color palettes for all those images can be selected from a single group of color palettes, based on image types or defect types.

Color palettes with one-dimensional gradation values (first color palettes) are used for reference images and optical images. The first color palettes each include a parameter used to display pattern edges. The gradation values are on a scale of 0 to 255 (256 values), for example. Color palettes with two-dimensional gradation values (second color palettes) are used for comparison images. When the gradation values of each of the first color palettes are on a 256 scale, the gradation values of each of the second color palettes are on a 256×256 scale. Each of the second color palettes has gradation values for reference image data and gradation values for optical image data. Gradation values for comparison image data are therefore represented by the gradation values for the reference image data and the gradation values for the optical image data. For instance, when the gradation value of a particular pixel of a reference image is represented by x and the gradation value of the corresponding pixel of an optical image is represented by y, the gradation value of the corresponding pixel of a comparison image is represented by (x, y). The second color palettes for comparison images are gamma-corrected by applying different correction coefficients to the colors with the same gradation value. By selecting color palettes based on defect types, the operator can select a color that makes defects more visible from among the colors with the same gradation value, which increases the visibility of defects.

The inspection apparatus 100 performs inspection in accordance with the above-described method. After receiving the inspection result from the inspection apparatus 100, the review apparatus 500 automatically selects appropriate color palettes. This selection is made by an algorithm, based on the types, sizes, locations, and properties of defects.

The color palette selection can instead be made discretionally by the operator based on the inspection result. For example, the operator can have a review screen of the inspection system 400 display an optical image that includes defects and its associated reference image on which the defect judgment is based, thereby selecting a color palette suitable for obtaining high-visibility images. The operator can also have the screen display a comparison image to select a color palette suitable for making defects visible.

Defects on thus obtained images are all highly visible enough for the operator to visually identify, irrespective of defect types and sizes. Thus, the operator can easily perform visual inspection on the defects on the images. The operator can select defects to be repaired based on the judgment of the repair necessity or repairability.

Masks for which the operator's reviews have been done are transferred to a repair apparatus together with necessary repair information. Examples of such repair information are coordinates within a mask; defect types (concave or convex), which are used to determine whether a light-shielding layer should be removed or replenished; and partial pattern data needed to identify defective patterns to be repaired. Based on such information, the repair apparatus performs defect repairs by burning away convex defects on a light-shielding layer with a focused ion beam or by filling concave defects with carbon. Repaired masks are inspected again, and those masks that passed the re-inspection become ready for shipment.

According to the above-described invention, multiple color palettes are provided, and suitable color palettes are selected from among them based on images and defects. Thus, defects can be visually identified with ease irrespective of defect types or sizes. Moreover, the use of a color palette with two-dimensional gradation values for creating comparison images makes it possible not only to know the presence or absence of defects but also to predict defect types.

The present invention is not limited to the above-described embodiments but can be changed or modified in various forms without departing from the scope of the invention.

For example, while the above embodiments are based on a die-to-database approach, a die-to-die approach can instead be adopted as the defect inspection method. Accordingly, the invention can be summarized as below.

A review apparatus according to a first aspect of the invention comprises: means for acquiring a first image and a second image by associating the data of the first image and the data of the second image with the gradation values defined by a color palette selected from among a plurality of color palettes; and means for acquiring a comparison image by associating comparison image data that can be acquired from the first image data and the second image data with the gradation values defined by a different color palette selected from among the plurality of color palettes.

In this case, if the first image data is reference image data and the second image data is optical image data, then, the first image is a reference image and the second image is an optical image. Of course, the first image data can be optical image data, and the second image data can be reference image data. These examples correspond to the die-to-database inspection. If, on the other hand, both of the first image data and the second image data are optical image data, then, the first image and the second image are optical images. This corresponds to the die-to-die inspection.

A review apparatus according to a second aspect of the invention comprises: means for acquiring a first image and a second image by associating the data of the first image and the data of the second image with the gradation values defined by a color palette selected from among a plurality of first color palettes; and means for acquiring a comparison image by associating comparison image data that can be acquired from the first image data and the second image data with the gradation values defined by a color palette selected from among a plurality of second color palettes. The plurality of second color palettes each have gradation values for the first image data and gradation values for the second image data; thus, gradation values for the comparison image data are represented by the gradation values for the first image data and the gradation values for the second image data.

In this case, if the first image data is reference image data and the second image data is optical image data, then, the first image is a reference image and the second image is an optical image. Of course, the first image data can be optical image data, and the second image data can be reference image data. These examples correspond to the die-to-data base inspection. If, on the other hand, both of the first image data and the second image data are optical image data, then, the first image and the second image are optical images. This corresponds to the die-to-die inspection.

When an inspection system according to the present invention is based on a die-to-die approach, the system comprises: means for acquiring a plurality of first optical images of an inspection object by irradiating the object with light; an inspection apparatus having means for comparing the plurality of first optical images against each other; and a review apparatus for receiving information on defect locations obtained by the comparing means and the plurality of first optical images. The review apparatus comprises: means for acquiring a plurality of second optical images by associating the data of the plurality of first optical images with the gradation values defined by a color palette selected from among a plurality of first color palettes; and means for acquiring a second comparison image by associating the data of a first comparison image that can be acquired from the data of the plurality of first optical images with the gradation values defined by a color palette selected from among a plurality of second color palettes.

While the description of the above-described embodiments has centered on what is directly relevant to the device configurations and control methods of the present invention, it is of course possible to make modifications thereto. The scope of the present invention embraces any other pattern inspection apparatus or method that includes the essential elements of the invention and modifications which can made by those skilled in the art.

The features and advantages of the present invention may be summarized as follows:

According to a first aspect of the invention, a first image and a second image are acquired by associating the data of the first image and the data of the second image with the gradation values defined by a color palette selected from among a plurality of color palettes. Further, a comparison image is acquired by associating comparison image data that can be acquired from the first image data and the second image data with the gradation values defined by a different color palette selected from among the plurality of color palettes. In accordance with this aspect of the invention, a review apparatus is provided which allows the operator to visually identify defects with ease irrespective of defect types and sizes.

According to a second aspect of the invention, a first image and a second image are acquired by associating the data of the first image and the data of the second image with the gradation values defined by a color palette selected from among a plurality of first color palettes. Further, a comparison image is acquired by associating comparison image data that can be acquired from the first image data and the second image data with the gradation values defined by a color palette selected from among a plurality of second color palettes. Thus, a review apparatus can be provided which allows the operator to visually identify defects with ease irrespective of defect types and sizes.

In this second aspect, gradation values for the comparison image data are represented by gradation values for the first image data and gradation values for the second image data. This allows the operator not only to know the presence or absence of defects but also to predict defect types.

According to a third aspect of the invention, a review apparatus includes means for acquiring a second optical image and a second reference image by associating the data of a first optical image and the data of a first reference image with the gradation values defined by a color palette selected from among a plurality of first color palettes. The review apparatus further includes means for acquiring a second comparison image by associating the data of a first comparison image that can be acquired from the first optical image data and the first reference image data with the gradation values defined by a color palette selected from among a plurality of second color palettes. In accordance with this third aspect, a review apparatus is provided which allows the operator to visually identify defects with ease irrespective of defect types and sizes.

According to a fourth aspect of the invention, a review apparatus includes means for acquiring a plurality of second optical images by associating the data of a plurality of first optical images with the gradation values defined by a color palette selected from among a plurality of first color palettes. The review apparatus further includes means for acquiring a second comparison image by associating the data of a first comparison image that can be acquired from the data of the plurality of first optical images with the gradation values defined by a color palette selected from among a plurality of second color palettes. In accordance with this fourth aspect, a review apparatus is provided which allows the operator to visually identify defects with ease irrespective of defect types and sizes.

Obviously many modifications and variations of apparatus and/or methods are possible in light of the present invention.

It is therefore to be understood that within the scope of the appended claims the invention may be practiced otherwise than as specifically described.

The entire disclosure of a Japanese Patent Application No. 2009-239847, filed on Oct. 16, 2009 including specification, claims, drawings and summary, on which the Convention priority of the present application is based, are incorporated herein.

What is claimed is:

1. A review apparatus comprising:
   a device to acquire a first image and a second image by associating data of the first image and data of the second image with gradation values defined by a one-dimensional color palette selected from among a plurality of one-dimensional first color palettes; and
   a device to acquire a comparison image by associating comparison image data that can be acquired from the first image data and the second image data with gradation values defined by a two-dimensional color palette selected from among a plurality of two-dimensional second color palettes,
   wherein the plurality of two-dimensional second color palettes each have gradation values for the first image data along a first axis and gradation values for the second image data along a second axis, and wherein gradation values for the comparison image data are represented by the gradation values for the first image data and the gradation values for the second image data, the gradation values of the first image data being different from the gradation values of the second image data.

2. The review apparatus of claim 1 wherein the plurality of first color palettes each include pattern edge information and the plurality of second color palettes are each gamma-corrected by using different correction coefficients for colors of a gradation value.

3. An inspection system comprising:
   a device to acquire a first optical image of an inspection object by irradiating the object with light;
   a device to create a first reference image against which to compare the first optical image;
   an inspection apparatus including a comparing device to compare the first optical image against the first reference image; and
   a review apparatus to receive information on defect locations obtained by the comparing device and also to receive the first optical image and the first reference image, wherein the review apparatus comprises:
   a device to acquire a second optical image and a second reference image by associating data of the first optical image and data of the first reference image with gradation values defined by a one-dimensional color palette selected from among a plurality of one-dimensional first color palettes; and
   a device to acquire a second comparison image by associating data of a first comparison image that can be acquired from the first optical image data and the first reference image data with gradation values defined by a two-dimensional color palette selected from among a plurality of two-dimensional second color palettes, a first axis of the two-dimensional color palette corresponding to gradation values of the first optical image data and a second axis of the two-dimensional color palette corresponding to gradation values of the first reference image data, the gradation values of the first image being different from the gradation values of the second image.

4. The inspection system of claim 3 wherein the plurality of color palettes each include pattern edge information and are each gamma-corrected by using different correction coefficients for colors of a gradation value.

5. The inspection system of claim 4 wherein the first reference image is created from design data of the inspection object.

6. The inspection system of claim 4 wherein the first reference image is created from an optical image of the inspection object.

7. A review method comprising:
   acquiring a first image and a second image by associating data of the first image and data of the second image with gradation values defined by a one-dimensional color palette selected from among a plurality of one-dimensional first color palettes;
   acquiring a comparison image by associating comparison image data acquired from the first image data and the second image data with gradation values defined by a two-dimensional color palette selected from among a plurality of two-dimensional second color palettes,
   wherein the plurality of two-dimensional second color palettes each have gradation values for the first image data along a first axis and gradation values for the second image data along a second axis, and wherein gradation values for the comparison image data are represented by the gradation values for the first image data and the gradation values for the second image data, the gradation values of the first image being different from the gradation values of the second image.

8. The review method of claim 7, wherein the plurality of first and second color palettes each include pattern edge information and are each gamma-corrected by using different correction coefficients for colors of a gradation value.

9. The review method of claim 7, wherein the first reference image is created from design data of an inspection object.

10. The review method of claim 7, wherein the first reference image is created from an optical image of an inspection object.